United States Patent
Inanobe et al.

(10) Patent No.: US 7,030,376 B2
(45) Date of Patent: Apr. 18, 2006

(54) ELECTRON BEAM APPARATUS AND METHOD FOR PRODUCTION OF ITS SPECIMEN CHAMBER

(75) Inventors: Tsuyoshi Inanobe, Mito (JP); Sho Takami, Hitachinaka (JP); Yoichi Ose, Mito (JP); Katsuhiro Sasada, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 10/742,901

(22) Filed: Dec. 23, 2003

(65) Prior Publication Data

US 2004/0135082 A1    Jul. 15, 2004

(30) Foreign Application Priority Data

Jan. 8, 2003   (JP)   ............................. 2003-001684

(51) Int. Cl.
  *G01N 23/00*   (2006.01)
(52) U.S. Cl. ....................... 250/306; 250/310; 250/311
(58) Field of Classification Search ................ 250/306, 250/310, 311
See application file for complete search history.

(56) References Cited

U.S. PATENT DOCUMENTS 6,300,755 B1 * 10/2001 Elmer et al. ................ 324/71.3

FOREIGN PATENT DOCUMENTS

JP             61059825 A   *   3/1986

* cited by examiner

*Primary Examiner*—Nikita Wells
*Assistant Examiner*—Paul M. Gurzo
(74) *Attorney, Agent, or Firm*—Dickstein Shapiro Morin & Oshinsky LLP

(57) ABSTRACT

A structure of an electron beam apparatus having shielding properties for shielding against an environmental magnetic field is provided. The electron beam apparatus comprises a mirror barrel for housing a magnetic lens for converging an electron beam onto a specimen and a specimen chamber for housing the specimen, wherein a non-magnetic material having conductivity is used as a material for at least one of the mirror barrel and a main body of the specimen chamber. The material for the mirror barrel or the main body of the specimen chamber is an aluminum alloy and a thickness of a sidewall of the mirror barrel or the main body of the specimen chamber is 10 mm or more. A magnetic plate having a thickness smaller than that of the sidewall of the mirror barrel or the main body of the specimen chamber is provided on an inner sidewall of the mirror barrel or the main body of the specimen chamber.

2 Claims, 5 Drawing Sheets

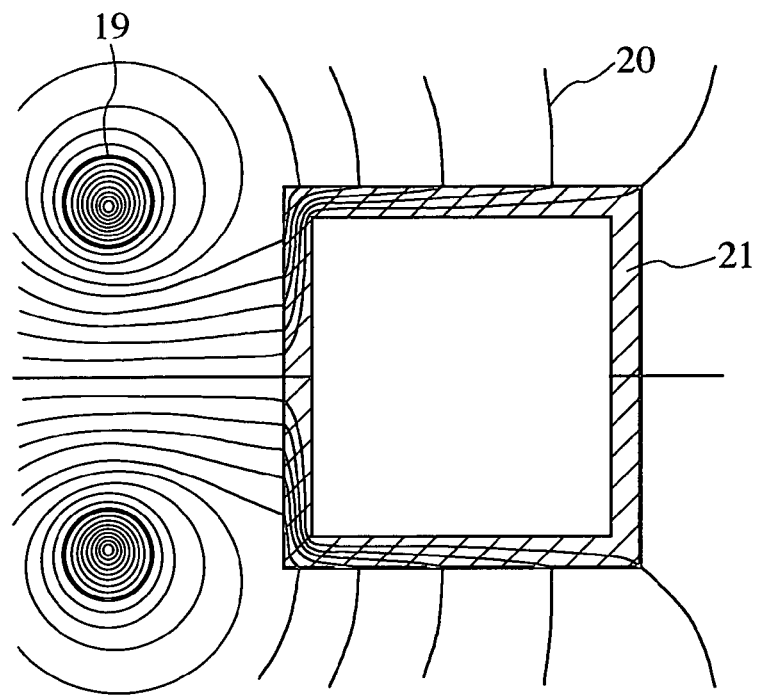
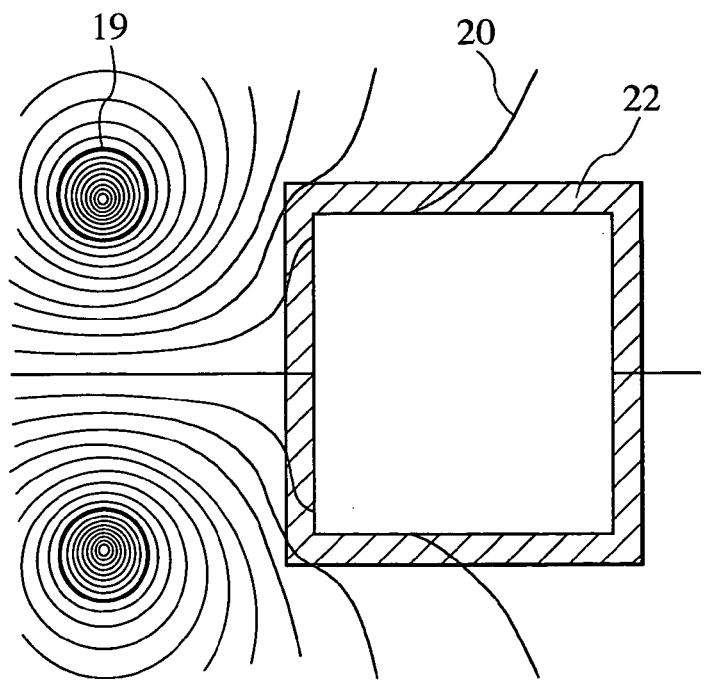

# ELECTRON BEAM APPARATUS AND METHOD FOR PRODUCTION OF ITS SPECIMEN CHAMBER

BACKGROUND OF THE INVENTION

The present invention relates to an electron beam apparatus and a method for production of its specimen chamber.

A specimen chamber of an electron beam apparatus such as an electron microscope is required to have strength since heavy components such as an electron gun and a lens barrel are mounted on its upper part, and it is necessary to use a shield material for shielding against an environmental magnetic field in order to prevent a magnetic field external to the specimen chamber from influencing the track of the electron beam; therefore, a strong magnetic material such as iron is used for the specimen chamber. As used herein, the environmental magnetic field means an AC magnetic field generated from an AC appliance around the electron beam apparatus and a DC magnetic field such as the earth magnetism.

The magnetic material is used for the specimen chamber because the magnetic material having small magnetic resistance absorbs the environmental magnetic field applied externally to the specimen chamber thereby to prevent the environmental magnetic field from hindering the electron beam irradiated on the center of the specimen chamber. A method of shielding the overall mirror barrel using a high magnetic permeability material such as Permalloy and a method of shielding a periphery of an object glass are also known in the art (see Japanese Patent No. 2667714, page 2 and FIGS. 1 and 2, for example).

Production steps such as a heat treatment for annealing the material and welding junction of plate materials are required for producing the specimen chamber made from iron or permalloy thereby to increase the production cost. When the high magnetic permeability material such as pure iron or Permalloy is selected among magnetic materials for the purpose of improving the shielding properties against the environmental magnetic field, the material cost is increased. Further, since the specimen chamber made from pure iron or Permalloy is a heavy component, working efficiency in machining and handling the specimen chamber is lowered, and it is dangerous to handle such heavy component.

Also, since the electron beam transmits through the mirror barrel and the specimen chamber of the electron beam apparatus to reach their insides, it is necessary to stably maintain a vacuum state. However, when iron is used for the mirror barrel or the specimen chamber, a vacuum leakage from the welding junction of the plate materials may undesirably occur.

SUMMARY OF THE INVENTION

An object of the present invention is to provide a structure of an electron beam apparatus having shielding properties for shielding against an environmental magnetic field.

In order to attain the above object, a non-magnetic material having conductivity is used as a material for at least one of a mirror barrel and a main body of a specimen chamber of an electron beam apparatus.

Further, in addition to the use of the non-magnetic material having conductivity for at least one of the mirror barrel and the main body of the specimen chamber of the electron beam apparatus, a magnetic plate having a thickness smaller than that of the mirror barrel or the main body of the specimen chamber is provided on an inner wall of the mirror barrel or the main body of the specimen chamber.

Further, in addition to the use of the non-magnetic material having conductivity for at least one of the mirror barrel and the main body of the specimen chamber of the electron beam apparatus, an inner wall and/or an outer wall of the mirror barrel or the main body of the specimen chamber are/is subjected to magnetic plating.

Further, a sidewall and a bottom wall of the main body of the specimen chamber of the electron beam apparatus are integrally formed.

Further, the main body of the specimen chamber of the electron beam apparatus is produced by engraving and milling.

BRIEF DESCRIPTION OF THE DRAWING

Other objects and advantages of the invention will become apparent from the following description of embodiments with reference to the accompanying drawings in which:

FIG. 6 is a diagram showing isogams created according to another simulation;

FIG. 7 is a diagram showing isogams created according to another simulation;

DETAILED DESCRIPTION OF THE PREFERRED EMBODIMENTS

Figure 1:
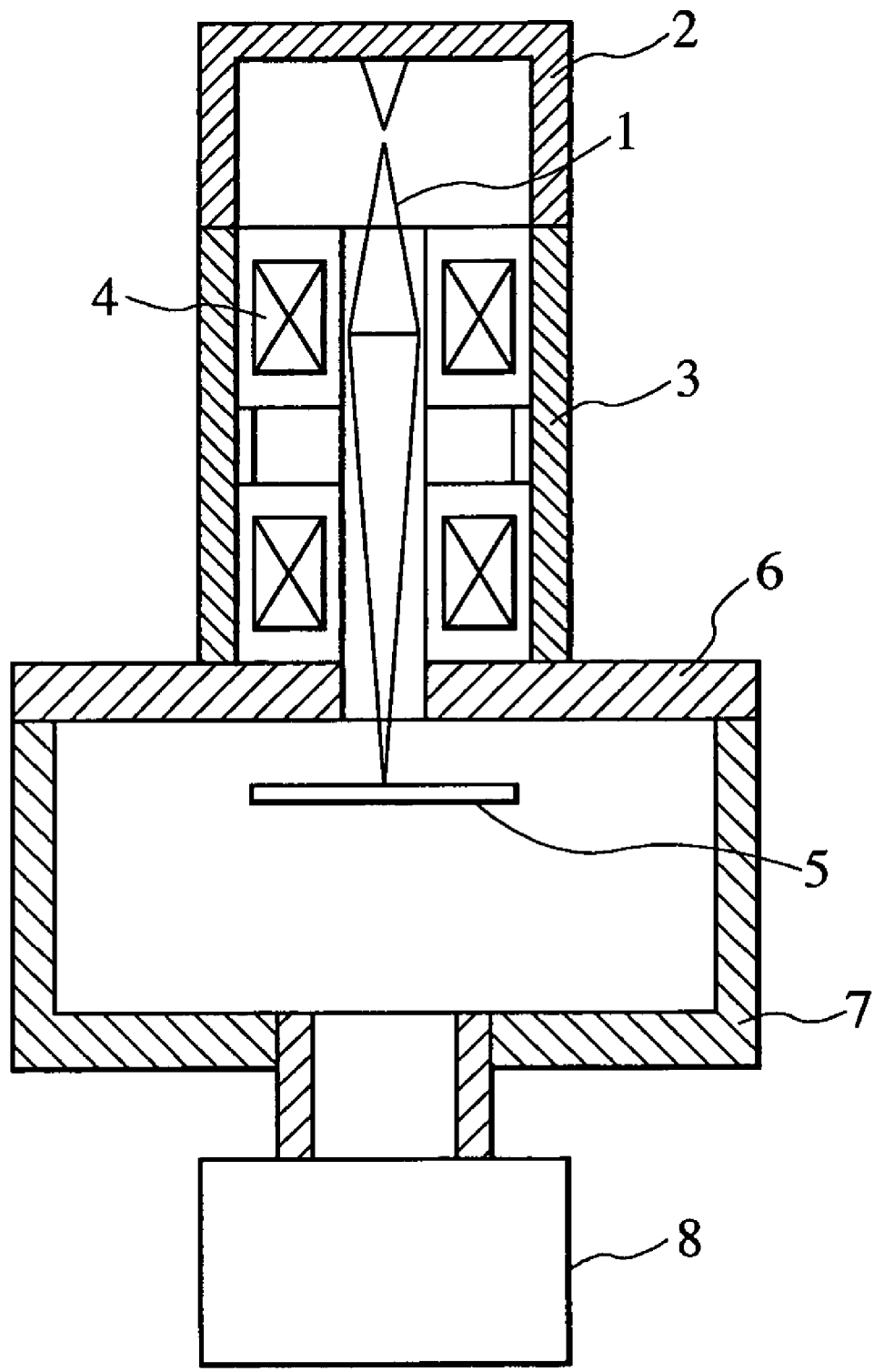
FIG. 1 is a longitudinal sectional view of an electron microscope.

Hereinafter, preferred embodiments of the present invention will be described with reference to the accompanying drawings. FIG. 1 is a longitudinal sectional view showing an electron microscope as one example of an electron beam apparatus. An electron beam 1 is emitted from an electron gun incorporated in an electron gun unit 2 and is controlled by a unit of magnetic field lenses 4 incorporated in a mirror barrel 3 to reach an observation specimen 5 inside a specimen chamber 7. The observation specimen 5 is placed on a table (not shown) which is moved so as to irradiate a desired region of the observation specimen 5 with the electron beam 1.

An evacuator 8 is provided at a part of the specimen chamber 7, the part being a lower part in FIG. 1, and maintains the insides of the specimen chamber 7, mirror barrel 3 and electron gun unit 2 under vacuum thereby to eliminate gases which are obstacles to the irradiation with the electron beam 1.

Since an upper part of the specimen chamber 7 is open, the specimen chamber 7 is covered with a specimen chamber top plate 6 for excluding outside air. The electron gun unit 2 and the mirror barrel 3 are mounted on the specimen chamber top plate 6.

A magnetic material such as iron has heretofore been used for the ceiling and sidewalls of the electron gun unit 2, the sidewalls of the mirror barrel 3, the specimen chamber top plate 6, and the sidewalls and bottom wall of the specimen chamber 7 for the purpose of preventing an environmental magnetic field from hindering electron beams 1. Further, iron having a certain thickness has been used for the specimen chamber top plate 6 for the purposes of supporting the heavy components such as the electron gun unit 2 and the mirror barrel 3 and preventing deformation thereof. Also, iron having a certain thickness has been used for the specimen chamber 7 for the purpose of supporting the heavy components such as the specimen chamber top plate 6.

Figure 4A:
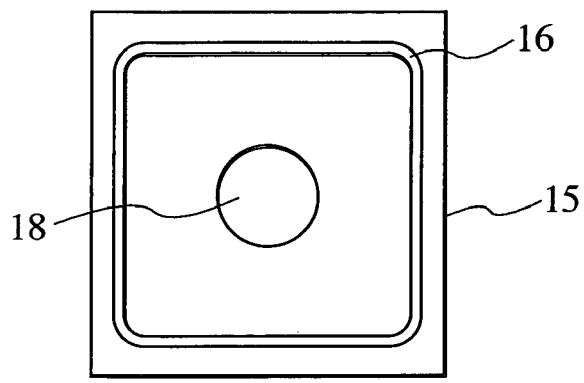
FIG. 4A is a top view showing one example of a structure of a specimen chamber.
Figure 4B:
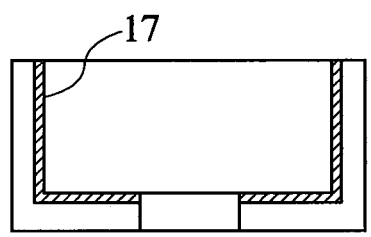
FIG. 4B is a longitudinal sectional view of the specimen chamber in FIG. 4A.

In contrast, in this invention, a structure of a combination of an aluminum plate and a magnetic plate having a thickness smaller than that of the aluminum plate or a structure wherein an aluminum plate is coated with a magnetic material, both of which will be described in detail later, is employed for the specimen chamber 7 as shown in FIGS. 4A and 4B.

Figure 2:
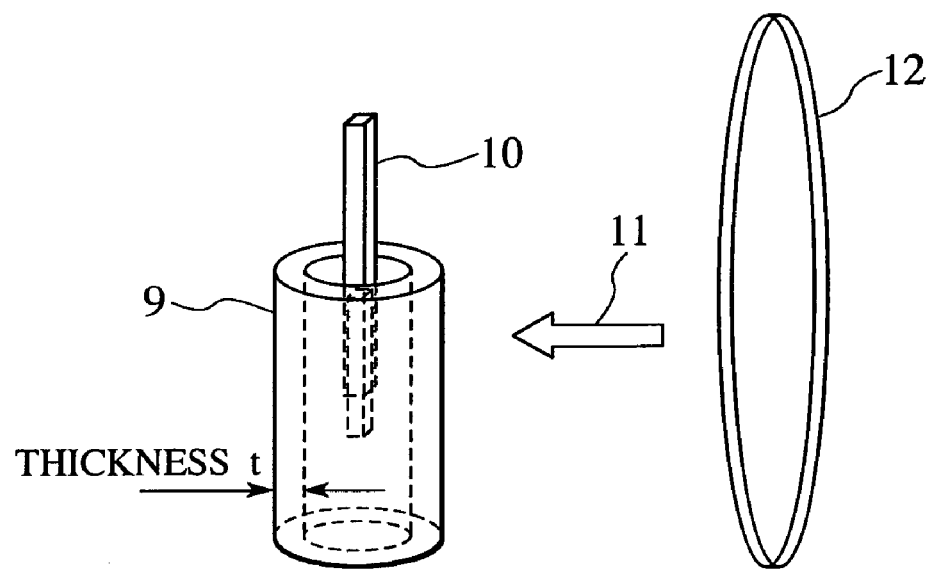
FIG. 2 is a perspective view showing an experiment of a principle relating to the present invention.
Figure 3:
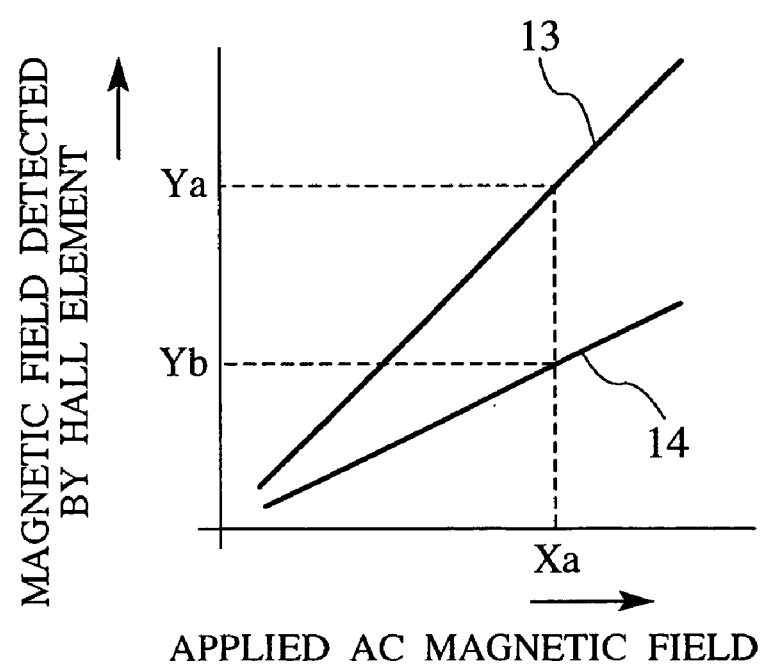
FIG. 3 is a graph showing results of the experiment of the principle relating to the invention.

FIG. 2 is a perspective view showing an experiment of a principle relating to the invention. FIG. 3 is a graph showing results of the experiment of the principle relating to the invention.

Referring to FIG. 2, a Hall element 10 was inserted into an inside of an experimental barrel 9 of a hollow cylinder shape which is formed from an aluminum alloy and has a thickness of t. An AC magnetic field 11 was applied externally to the experimental barrel 9 using a magnetic field generation coil 12. A value of the AC magnetic field 11 and a value of a magnetic field detected by the Hall element 10 were compared with each other to detect an attenuation effect. The thicknesses t of the experimental barrel 9 were 2.5 mm and 30 mm.

Results of the experiment are shown in FIG. 3. The horizontal axis is the value of the AC magnetic field, and the vertical axis is the value of the magnetic field detected by the Hall element 10. A characteristic inclination 13 was obtained when the thickness t of the experimental barrel 9 was 2.5 mm, and a characteristic inclination 14 was obtained when the thickness t was 30 mm.

When the thickness t of the experimental barrel 9 is 2.5 mm as indicated by the characteristic inclination 13, the applied AC magnetic field and the AC magnetic field detected by the Hall element 10 substantially have a relationship of $Ya=Xa$ wherein the AC magnetic field 11 is not attenuated, and shielding properties against the AC magnetic field is apparently low. In contrast, when the thickness t of the experimental barrel 9 is 30.0 mm as indicated by the characteristic inclination 14, the relationship is $Yb=\alpha Xa$ ($\alpha$ is a constant, $\alpha<1$), and the AC magnetic field 11 is attenuated by a multiple of $\alpha$.

Thus, it is apparent that the non-magnetic material such as aluminum contributes to improvement in the shielding properties against the AC magnetic field depending on the thickness. Aluminum is a non-magnetic material having high conductivity. The AC magnetic field is attenuated in such a manner that an eddy current which is generated by the AC magnetic field applied to aluminum causes a magnetic field of backward direction (opposite phase) thereby to reflect and attenuate the AC magnetic field.

Figure 9:
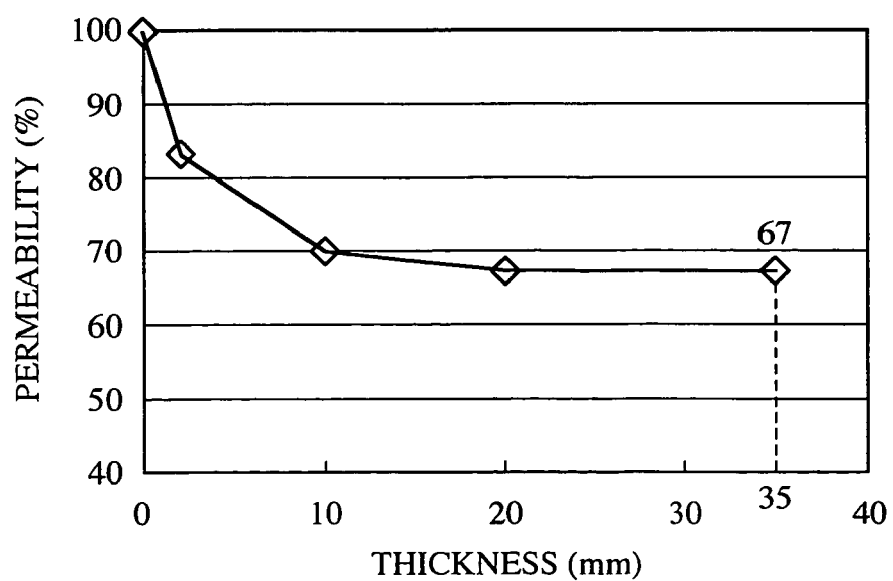
FIG. 9 is a graph showing a relationship between a thickness of an aluminum alloy used for the specimen chamber and permeability for an AC magnetic field.

FIG. 9 is a graph showing a relationship between a thickness of the aluminum alloy used for the specimen chamber 7 shown in FIG. 1 and permeability for an AC magnetic field. This relationship graph is obtained according to a simulation based on the experiment results shown in FIG. 3. When the thickness exceeds 10 mm, the permeability for the AC magnetic field is not deteriorated sharply from about 70% and, therefore, it is apparent that an attenuation ratio of 30% is secured when the thickness is 10 mm or more. In this embodiment, the thickness of the specimen chamber 7 is set to 35 mm in view of the strength. According to the experiment, the permeability of an iron material having the thickness of 35 mm is 75%, and the permeability of aluminum is slightly better than that of the iron material.

Accordingly, it is possible to prevent the environmental magnetic field by using the aluminum alloy which is non-magnetic and has relatively high conductivity for the electron gun unit, the mirror barrel, the specimen chamber top plate, and the specimen chamber similarly to or more efficiently than using the iron material.

Shown in FIGS. 4A and 4B is another embodiment which is another example of the structure of the specimen chamber 7 of FIG. 1. FIG. 4A is a top view of the specimen chamber, and FIG. 4B is a longitudinal sectional view of the specimen chamber. A material used for a specimen chamber body 15 is an aluminum alloy, and a plate 17 which has a thickness smaller than that of the specimen chamber body 15 and is formed from a material having relatively high magnetic permeability such as an iron material or Permalloy is provided on an inner wall of the specimen chamber body 15. Aluminum attenuates the AC magnetic field as described with reference to FIGS. 3 and 9 but does not attenuate a DC magnetic field such as the earth magnetism; therefore, the structure wherein the aluminum alloy is used in combination with the magnetic material is employed for the purpose of attenuating the DC magnetic field.

A thickness of the specimen chamber body 15 is 10 mm or more according to the results shown in FIG. 9. A thickness of the plate 17 is about 1 mm since the thickness is sufficient for shielding against the DC magnetic field and strength is not required of the plate 17.

It is possible to achieve the same effect by a composite structure wherein the inner wall of the specimen chamber body 15 is subjected to magnetic plating using a liquid containing an ingredient such as iron, nickel, or cobalt as well as the composite structure described above wherein the non-magnetic plate having high conductivity such as an aluminum plate and the magnetic plate such as the iron plate whose thickness is less than that of the non-magnetic plate are used in combination. Further, it is possible to achieve a higher magnetic field shielding effect by subjecting the exterior as well as the interior of the specimen chamber body 15 to the magnetic plating.

Although the specimen chamber body 15 has been described in the foregoing, it is possible to achieve further environment magnetic field shielding properties by adopting the same structure to the electron gun unit 2, the mirror barrel 3, and the specimen chamber top plate 6 shown in FIG. 1.

Further, though a vacuum outlet 18 having a round hole shape for vacuum-discharging via the evacuator 8 shown in FIG. 1 is provided on the specimen chamber body 15, the size of the hole may be reduced and a plurality of the holes may be provided so as to impart the magnetic field shielding effect to the evacuator 8 in the case where invasion of magnetic field from the evacuator 8 is expected.

When the specimen chamber is produced by engraving and milling the aluminum alloy, it is possible to integrally form the sidewalls and the bottom wall and to omit the welding performed when using the iron material, thereby preventing a vacuum leakage. Further, it is possible to prevent stress concentration by rounding internal corners 16 of the specimen chamber body 15, thereby securing the strength.

Figure 5:
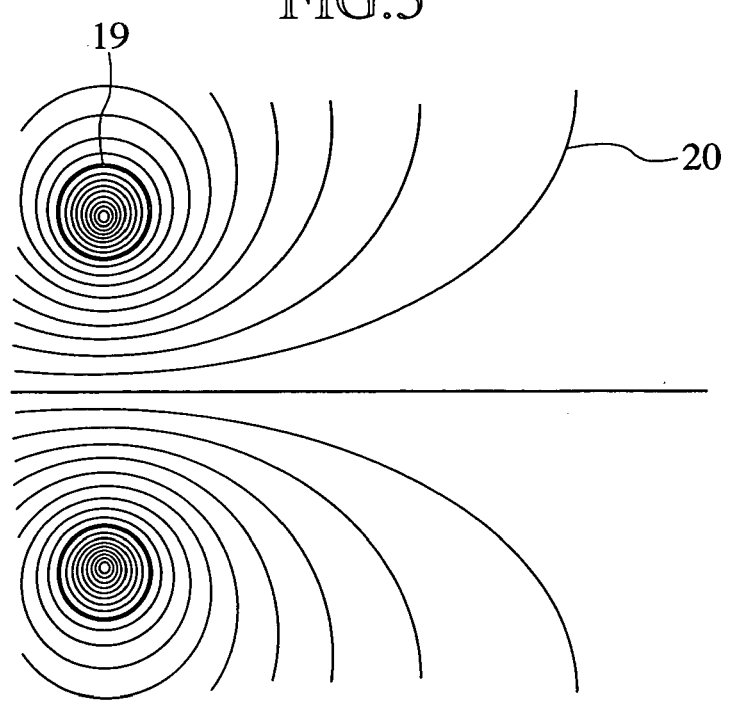
FIG. 5 is a diagram showing isogams created according to a simulation.
Figure 8:
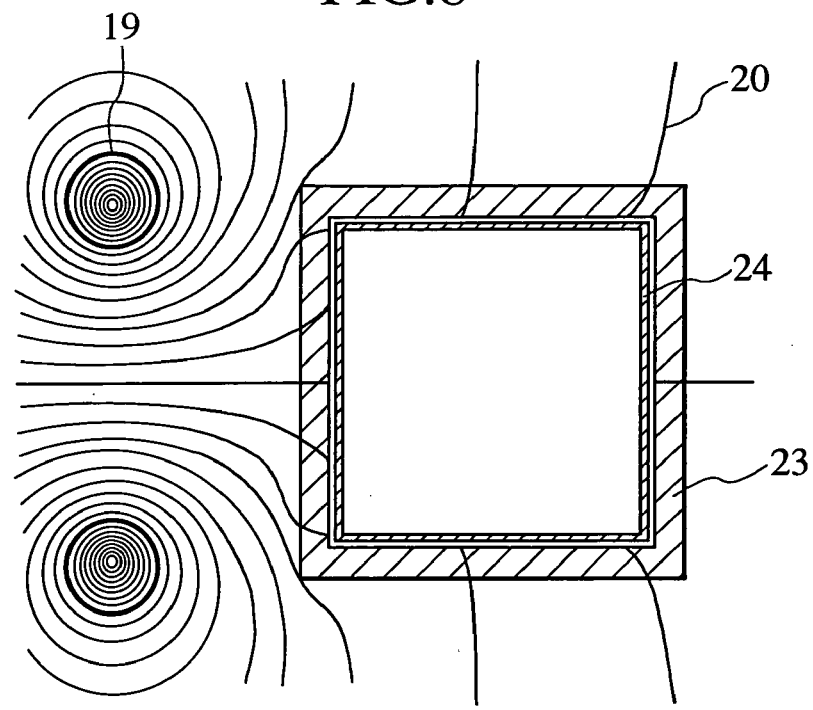
FIG. 8 is a diagram showing isogams created according to another simulation.

FIGS. 5 to 8 are diagrams each showing isogams created according to a simulation. Shown in FIG. 5 is the case where no specimen chamber is provided; shown in FIG. 6 is the case where a specimen chamber made from pure iron is placed in a magnetic field; shown in FIG. 7 is the case where a specimen chamber made from an aluminum alloy is placed in a magnetic field; and shown in FIG. 8 is the case where a specimen chamber wherein a specimen chamber body made from an aluminum alloy and a plate made from Permalloy are used in combination is placed in a magnetic field.

In FIG. 5, lines of magnetic force 20 indicating magnetism generated by an exciting coil 19 are defined as an environmental magnetic field. Here, in the environmental magnetic field, an AC magnetic field generated by an electronic appliance and a DC magnetic field such as the earth magnetism are overlapped with each other. When the specimen chamber 21 made from pure iron and having a thickness of 35 mm is placed in the environmental magnetic field, the lines of magnetic force 20 are absorbed by the material to pass therethrough as shown in FIG. 6, so that an inside of the specimen chamber 21 cannot be influenced by the lines of magnetic force 20. Thus, it is possible to prevent adverse effect on an electron beam inside the specimen chamber 21.

Shown in FIG. 7 is the case where the specimen chamber 22 is made from an aluminum alloy and has a thickness of 35 mm. Part of lines of magnetic force 20, i.e. an AC magnetic field, is reflected and attenuated by a backward (opposite phase) magnetic filed generated by an eddy current. However, the rest of the lines of magnetic force 20 which has not been reflected, i.e. part of the AC magnetic field and a DC magnetic field, may penetrate the specimen chamber 22 in some cases to adversely effect on an electron beam. Accordingly, a plate 24 made from a highly magnetic permeable material such as iron or permalloy and having a thickness of 1 mm is internally combined with the specimen chamber 23 made from an aluminum alloy as shown in FIG. 8 so as to provide a specimen chamber of the composite structure. As a result, the part of the lines of magnetic force 20 that has not been reflected is absorbed or allowed to pass through the specimen chamber. Thus, an effect similar to that achieved by the use of pure iron shown in FIG. 6 is achieved.

Although the plate 24 is used as shown in FIG. 8, it is possible to achieve a greater effect by subjecting the interior and exterior of the specimen chamber 23 to magnetic plating using a liquid containing an ingredient such as iron, nickel, or cobalt.

Thus, by adopting the composite structure of the non-magnetic material having relatively high conductivity and the magnetic material or the magnetic plating to the specimen chamber of an electron beam apparatus, it is possible to efficiently shield against the environmental magnetic field constituted of the AC magnetic field and the DC magnetic field, thereby preventing the environmental magnetic field from disturbing the electron beam.

Further, by integrally forming the sides and the bottom through engraving and milling the non-magnetic material, it is possible to eliminate the problem of vacuum leakage caused by welding. Yet further, by rounding four inner corners, it is possible to avoid stress concentration, thereby securing sufficient strength.

The heat treatment of annealing and the welding of plate materials which are required in the case of using the iron material are omitted by the use of the aluminum material which has good workability, thereby reducing the number of production steps, the production time, and the production cost. Further, since aluminum is lighter than the iron material, the efficiency of material handling operation and the safety are improved.

As described in the foregoing, it is possible to provide the structure of the electron beam apparatus having shielding properties for shielding against the environmental magnetic field.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. An electron beam apparatus comprising:
    a mirror barrel for housing magnetic lens for converging an electron beam onto a specimen; and
    a specimen chamber for housing the specimen;
    wherein a non-magnetic material having conductivity is used as a material for at least one of the mirror barrel and a main body of the specimen chamber; and
    wherein an inner wall and/our outer wall of the mirror barrel or the main body of the specimen chamber is/are subjected to magnetic plating.

2. The electron beam apparatus according to claim 1, wherein the magnetic plating is processed using a liquid containing an ingredient such as iron, nickel, or cobalt.

* * * * *